United States Patent [19]

Hennedy

[11] Patent Number: 5,362,989

[45] Date of Patent: Nov. 8, 1994

[54] ELECTRICAL ISOLATION FOR POWER-SAVING PURPOSES

[75] Inventor: Michael Hennedy, New York, N.Y.

[73] Assignee: AlliedSignal Inc., Morris Township, Morris County, N.J.

[21] Appl. No.: 991,684

[22] Filed: Dec. 16, 1992

[51] Int. Cl.$^5$ .................. H03K 3/01; H03K 3/353; H01L 25/00

[52] U.S. Cl. .................. 327/544; 257/723; 327/538; 327/543; 327/565; 327/566

[58] Field of Search ............... 307/303.1, 296.1, 296.3, 307/296.5, 296.6, 303, 303.2, 304; 257/370, 723, 728

[56] References Cited

U.S. PATENT DOCUMENTS

| | | | |
|---|---|---|---|
| 4,475,119 | 10/1984 | Kuo et al. | 307/303.1 |
| 4,649,416 | 3/1987 | Borkowski et al. | 257/728 |
| 4,783,697 | 11/1988 | Benenati et al. | 257/728 |
| 5,034,796 | 7/1991 | Zommer | 307/303.1 |
| 5,111,069 | 5/1992 | Deierling et al. | 307/304 |
| 5,250,821 | 10/1993 | Ferla et al. | 257/723 |

*Primary Examiner*—Timothy P. Callahan
*Assistant Examiner*—Trong Phan
*Attorney, Agent, or Firm*—Donald B. Paschburg; Howard G. Massung

[57] ABSTRACT

A system for reducing power in electronic systems blocks current paths by electrically isolating idle, targeted devices through switching off the various device's entire sets of pins from the rest of the electronic system. Solid state switches are connected to every pin of a targeted device. In one logic state a control signal will turn the switches on and thereby connect the targeted device to the remainder of the system. In another logic state, the control signal will isolate the targeted device.

12 Claims, 1 Drawing Sheet

ELECTRICAL ISOLATION FOR POWER-SAVING PURPOSES

BACKGROUND OF THE INVENTION

1. Field of the Invention

The present invention relates to reducing power consumption and more particularly to electrically isolating idle or non-used devices to save power.

2. Description of the Prior Art

An important objective of battery-powered systems and products is to prolong the life of the battery. This provides many advantages including, lower operating costs because of the reduced frequency of changing batteries, more stable and reliable operation and an edge over competition in the marketplace.

An example where reducing power consumption is critical is a battery-powered portable computer designed for military applications. Battery life is crucial because of the above reasons. A typical computer includes interfacing capability to enable the computer to communicate with many devices and other computers. In any given application, many functions and devices of the computer are sitting idle simply because the application does not use them. In other cases, the uses of some functions will be so sporadic that the hardware implementing those functions will remain inactive for long periods of time. To reduce power consumption, there is a need for a system that can shut off power to idle devices and integrated circuits without impacting the active circuitry.

The prior art addressed the above problem by removing either the power connection or the ground connection or both connections of the idle devices. The problem with these techniques is that the signal pins of the idle devices are still connected to the rest of the circuitry and D.C. current paths remain active through those pins, thereby dissipating valuable energy. Also, in CMOS chips, a latch-up problem can occur by having the power and ground pins in indeterminate states.

A traditional way of reducing power dissipation in clocked CMOS devices is through lowering the clock rate of the chip since the operating frequency is directly proportional to power consumption. Many systems however, do not include clocked CMOS devices that can be targeted for the power down mode of operation.

SUMMARY OF THE INVENTION

The present invention provides a system for reducing power consumption in electronic systems. Power consumption is reduced by blocking current paths, both dynamically and upon initial configuration, by electrically isolating idle or non-used devices, through switching off the various devices' entire sets of pins to the rest of the circuitry.

Power consumption is reduced dynamically because the system during the course of operation, when utilizing the present invention, may turn on and off the power-managed subsystem many times. The system, in its initial configuration (at the start of operation), will determine if there is a need to turn a given subsystem either on or off and essentially will keep the subsystem in that state, on or off, for the remaining period of operation.

The present invention electrically isolates targeted inactive devices by inserting a series solid state switch with every pin on the device. In one logic state, a controlling signal will turn the switches on and thereby connect the chip to the rest of the system. In the other logic state, the controlling signal will turn the switches off, effectively removing the devices from the printed circuit board, electrically. When all of the device's pins are isolated from the active circuitry, no DC or AC current paths will exist throughout the device and interference with other active devices will be minimized.

DETAILED DESCRIPTION OF THE INVENTION

Power management is well-suited where functions of a system have a low duty cycle of operation, or remain totally idle in some applications. For example, an AMD7971 Data Compression/Expansion Processor chip is a bipolar device that consumes about 2.5 watts and is estimated to run less than 5% of the time. If power management is applied, the device would then consume about 68 mW when idle, which would be over 95% of the time, and less than 3 watts when operational. This translates to 2.5 watt-hour for no power management versus 0.22 watt-hour.

Power management can be accomplished through software control such that only necessary devices could be powered up and connected. Other devices, that work a fraction of the time or not at all, could be removed. The object is to save over 33% of power dissipation without any sacrifice in performance. Imagine that every time the MPU and the floating point processor (FPP) are sitting idle, drawing current and inactive, a power conservation circuit would determine to totally remove both devices from the system. The optimum way to accomplish this is to physically extract the devices from the board. Since in reality this is not feasible, the next best method will have to be used, which is to electrically remove the devices.

There are two methods to isolate the devices. The first is to install series switches to VCC and GND pins, where a control signal can, in one logic state make the connection, and in the other logic state, disconnects the VCC and GND connections to the pins. Potential problems may exist with this method since the signal pins remain connected to the rest of the circuitry. The second, and more comprehensive method involves installing the switch in series with every pin on the device.

Suppose the chip that must be isolated has 128 pins. Adding 128 discrete switches to the printed circuit board will take up quite a bit of space. The utilization of the present invention however, includes the design of a simple custom integrated circuit that contains nothing but 128 MOSFET switches with very low on-resistance and a substrate-ground connection. The integrated circuit may be mounted in a special package.

Figure 1:
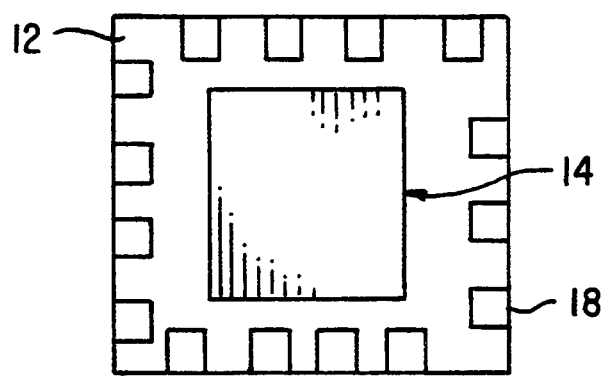
FIG. 1 illustrates a top view of one embodiment of packaging including the present invention.
Figure 2:
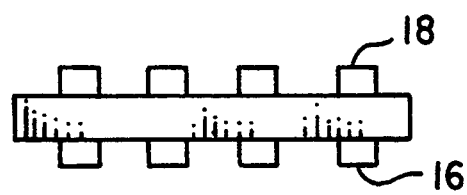
FIG. 2 illustrates a side view of one embodiment of packaging including the present invention.

FIGS. 1 and 2 show top and side views of the package 12 including die cavity 14. The bottom pins 16 connect the on-chip switches to the circuit driver, fan-in, or circuit load, fan-out, of the device to be power-managed; while the top pins 18 become the device's new signal pins. It is difficult to get low enough impedance switches to accommodate power pins, where the "On" resistance must be on the order of 0.1 ohm or less, therefore, VCC and GND pins must be handled with discrete switches.

Figure 3:
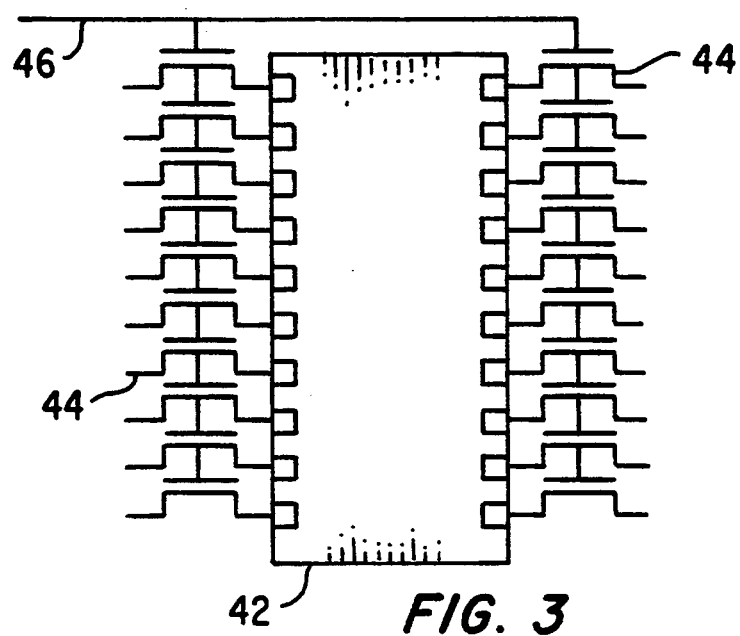
FIG. 3 illustrates one example of a device incorporating the present invention.

FIG. 3 shows the configuration of power managed device 42 with switches 44 around it, as it would be connected on a printed circuit board (not shown). Switches 44 are controlled by control 46.

An example of the present invention is a custom-integrated circuit that contains 128 bidirectional switches, 256 signal pins, 4 control inputs, each controlling a group of 32 switches, and 1 pin for ground reference. The operation of the integrated circuit would be as explained previously.

The mechanical packaging of this integrated circuit should be designed to complement the targeted device. The packaged integrated circuit could be mounted underneath the device to be powered down such that the top side of the package contains 128 signal pins connected to the target device's pins and the bottom side of the package contains the complementary 128 signal pins to be connected to other devices on the board. The mounting could be such that the integrated circuit pins and targeted device pins make contact. An alternate embodiment is to use Surface-Mount Technology (SMT), where both the integrated circuit and the targeted device occupy the same location on either side of the printed circuit board.

Ultimately, the preferred embodiment of the present invention is to design the switches into the targeted devices for power down. An external input can switch the devices in or out of the circuit.

Many systems can be designed with emphasis on power consumption using the present invention. For example, TTL or LS parts specifically designed for battery-powered systems or products can benefit from this invention. With the many advances in VLSI technology, more and more complex systems are becoming portable and battery-powered. Such designs can readily use the present invention.

The application of the present invention, i.e. electrically isolating devices through serially connected FET switches, can be extended to many other situations where the need may not be just power conservation. Memory board designs can use this technique to optimize memory devices' configurations by performing load-splitting.

Certain small scale integration and medium scale integration (SSI/MSI) devices can be altered to incorporate the FET switches and accomplish the power-switching function internally with the addition of one pin to control the switches. A good example is the tri-state driver buffer 74LS244. This device contains octal buffers, controlled with a pin that can make the outputs float. When the outputs are floating, the power can very well be disconnected to the device without being noticed by the rest of the circuitry. The output enable input pin can serve as a control to shut off power when the outputs are to be floated.

It is not intended that this invention be limited to the hardware arrangement, or operational procedures shown disclosed. This invention includes all of the alterations and variations thereto as encompassed within the scope of the claims as follows.

I claim:

1. In an electrical system of the type including a targeted device having a plurality of sets of pins, switching means for connecting and disconnecting the targeted device from the remainder of the electrical system thereby reducing power consumption, said switching means comprising:
   dynamic means connected to the targeted device for rendering said targeted device in an on state and an off state a multiplicity of times;
   initial configuration means connected to the targeted device for rendering said targeted device in one state of the on and off state, and for maintaining said targeted device in the rendered state for a period of operation of the electrical system;
   means connected to the targeted device for connecting and disconnecting entire sets of pins of the plurality of sets of pins of said targeted device from the electrical system;
   the switching means is integral with the targeted device; and
   an external input connects said targeted device to and disconnects said targeted device from the electrical system.

2. Switching means as described by claim 1, including:
   a plurality of switches, one connected to each pin in the plurality of sets of pins of the targeted device.

3. Switching means as described by claim 2, including:
   means connected to the plurality of serially for controlling said plurality of serially connected switches for rendering said switches in the on state to connect the targeted device to the electrical system.

4. Switching means as described by claim 2, including:
   means connected to the plurality of switches for controlling said plurality of serially connected switches for rendering said switches in the off state to disconnect the targeted device from the electrical system.

5. Switching means as described by claim 2, including:
   means connected to the plurality of serially for controlling said plurality of serially connected switches for rendering said switches in the on and off states to connect and disconnect the targeted device from the electrical system, respectively.

6. Switching means as described by claim 1, wherein the integrated circuit means further comprises:
   256 signal pins;
   4 control inputs each of which controls a group of 32 MOSFET switches; and
   1 pin for a ground reference.

7. In an electrical system of the type including a targeted device having a plurality of sets of pins, switching means for connecting and disconnecting the targeted device from the remainder of the electrical system thereby reducing power consumption, said switching means comprising:
   dynamic means for rendering said switching means in an on state and an off state a multiplicity of times;
   initial configuration means for rendering said switching means in one state of the on and off state, and for maintaining said targeted device in the rendered state for a period of operation of the electrical system;
   means for connecting and disconnecting entire sets of pins of the plurality of sets of pins of said targeted device from the electrical system;

the electrical system having 128 MOSFET switches with a low on-state resistance and a substrate-ground connection;

said switching means is disposed at a particular location on one side of a substrate; and the targeted device is disposed at the same location on the opposite side of the substrate.

8. Switching means as described by claim 7, including:

a plurality of switches, one connected to each pin in the plurality of sets of pins of the targeted device.

9. Switching means as described by claim 8, including:

means connected to the plurality of switches for controlling said plurality of serially connected switches for rendering said switches in the on state to connect the targeted device to the electrical system.

10. Switching means as described by claim 8, including:

means connected to the plurality of switches for controlling said plurality of serially connected switches for rendering said switches in the off state to disconnect the targeted device from the electrical system.

11. Switching means as described by claim 8, including:

means connected to the plurality of switches for controlling said plurality of serially connected switches for rendering said switches in the on and off states to connect and disconnect the targeted device from the electrical system; respectively.

12. Switching means as described by claim 7, wherein the electrical system further comprises:

256 signal pins;

4 control inputs each of which controls a group of 32 MOSFET switches; and 1 pin for a ground reference.

* * * * *

UNITED STATES PATENT AND TRADEMARK OFFICE
CERTIFICATE OF CORRECTION

PATENT NO. : 5,362,989
DATED : November 8, 1994
INVENTOR(S) : Michael Hennedy

It is certified that error appears in the above-identified patent and that said Letters Patent is hereby corrected as shown below:

Column 4,
Lines 3, 6 and 7, delete "connected to the targeted device";
Lines 4, 7 and 9, replace "targeted device" with -- switching means --;
Lines 27 and 40, replace "serially" with -- switches --; and
Lines 34 and 41, delete "serially connected".

Column 6,
Line 11, delete "serially connected".

Signed and Sealed this

Sixteenth Day of December, 2003

JAMES E. ROGAN
*Director of the United States Patent and Trademark Office*